US012777873B2

(12) United States Patent
Lim et al.

(10) Patent No.: US 12,777,873 B2

(45) Date of Patent: Oct. 27, 2026

(54) CHEMICAL SUPPLY DEVICE FOR USE IN SEMICONDUCTOR MANUFACTURING PROCESS

(71) Applicant: RC-Tech Co., Ltd., Yongin-si (KR)

(72) Inventors: Tae Hwa Lim, Yongin-si (KR); Myeong Mun Kim, Incheon (KR)

(73) Assignee: RC-Tech Co., Ltd., Yongin-si (KR)

( * ) Notice: Subject to any disclaimer, the term of this patent is extended or adjusted under 35 U.S.C. 154(b) by 388 days.

(21) Appl. No.: 18/433,046

(22) Filed: Feb. 5, 2024

(65) Prior Publication Data

US 2024/0274443 A1 Aug. 15, 2024

(30) Foreign Application Priority Data

Feb. 9, 2023 (KR) ........................ 10-2023-0017161

(51) Int. Cl.

*B01F 23/231* (2022.01)
*H05B 3/06* (2006.01)
*H05B 3/26* (2006.01)
*H10P 72/00* (2026.01)

(52) U.S. Cl.

CPC ........... *H10P 72/0402* (2026.01); *H05B 3/06* (2013.01); *H05B 3/26* (2013.01); *H05B 2203/021* (2013.01)

(58) Field of Classification Search

CPC ............. C23C 16/4482; C03B 2207/86; B01F 23/231; B01F 23/2311

See application file for complete search history.

(56) References Cited

U.S. PATENT DOCUMENTS 3,693,711 A * 9/1972 Zygiel .................... B21C 37/151 165/DIG. 397
3,987,133 A * 10/1976 Andra ...................... F24F 6/025 261/130
4,292,223 A * 9/1981 Theodore ................ C08L 83/04 524/188

(Continued)

FOREIGN PATENT DOCUMENTS

EP 1870490 A2 * 12/2007 ............. C23C 16/52
JP 2008-118080 A 5/2008
KR 10-2009-0047682 A 5/2009

OTHER PUBLICATIONS

Office Action for KR 10-2023-0017161 by Korean Intellectual Property Office dated Apr. 22, 2024.

*Primary Examiner* — Matthew J Daniels

(74) *Attorney, Agent, or Firm* — BROADVIEW IP LAW, PC

(57) ABSTRACT

According to various embodiments, there is provided a chemical supply device for use in a semiconductor manufacturing process, the chemical supply device including: a bubbler configured to contain a chemical solution to be used in a semiconductor manufacturing process and to evaporate the chemical solution; a constant temperature bath configured to accommodate the bubbler and to adjust a temperature of the chemical solution; and a heat transferring structure configured to enhance temperature adjustment efficiency of the chemical solution, wherein the heat transferring structure includes: a constant temperature cup configured to provide an accommodation space to have the bubbler seated therein; a heat transferring member disposed between a side surface area of the bubbler.

9 Claims, 9 Drawing Sheets

(56) References Cited

U.S. PATENT DOCUMENTS

| | | | | |
|---|---|---|---|---|
| 4,612,772 | A * | 9/1986 | Jones | C23C 16/4482 62/3.6 |
| 2012/0304935 | A1 * | 12/2012 | Oosterlaken | C23C 16/4482 261/153 |

* cited by examiner

CHEMICAL SUPPLY DEVICE FOR USE IN SEMICONDUCTOR MANUFACTURING PROCESS

CROSS-REFERENCE TO RELATED APPLICATION(S)

This application is based on and claims priority under 35 U.S.C. § 119 to Korean Patent Application No. 10-2023-0017161, filed on Feb. 9, 2023, in the Korean Intellectual Property Office, the disclosure of which is herein incorporated by reference in its entirety.

BACKGROUND

Field

Various embodiments of the disclosure relate to a chemical supply device for use in a semiconductor manufacturing process.

Description of Related Art

In a semiconductor manufacturing process, a bubbler may be used to evaporate a chemical solution necessary for the process. The bubbler contains a toxic chemical solution therein and evaporates the chemical solution with a fluid (for example, an inert gas) flowing thereinto. An amount of evaporation of the chemical solution contained in the bubbler may change according to a temperature, and accordingly, there is a need to adjust the temperature of the chemical solution in the bubbler.

SUMMARY

An object of the disclosure is to enhance thermal conduction efficiency between a bubbler containing a chemical solution and a constant temperature bath containing the bubbler.

According to various embodiments, there may be provided a chemical supply device for use in a semiconductor manufacturing process, the chemical supply device including: a bubbler configured to contain a chemical solution to be used in a semiconductor manufacturing process and to evaporate the chemical solution; a constant temperature bath configured to accommodate the bubbler and to adjust a temperature of the chemical solution; and a heat transferring structure provided by a combination of at least part of the constant temperature bath and the bubbler, and configured to enhance temperature adjustment efficiency of the chemical solution, wherein the heat transferring structure includes: a constant temperature cup configured to provide an accommodation space to have the bubbler seated therein; a heat transferring member disposed between a side surface area of the bubbler and an inner surface of the cup, at least part of the heat transferring member contacting a side surface of the bubbler; and a heating module disposed on an outer surface of the cup.

According to various embodiments, there may be provided a chemical supply device including a heat transferring member disposed between an outer surface of a bubbler and an inner surface of a constant temperature cup. Accordingly, thermal efficiency transmitted from the constant temperature bath to the bubbler may be enhanced.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
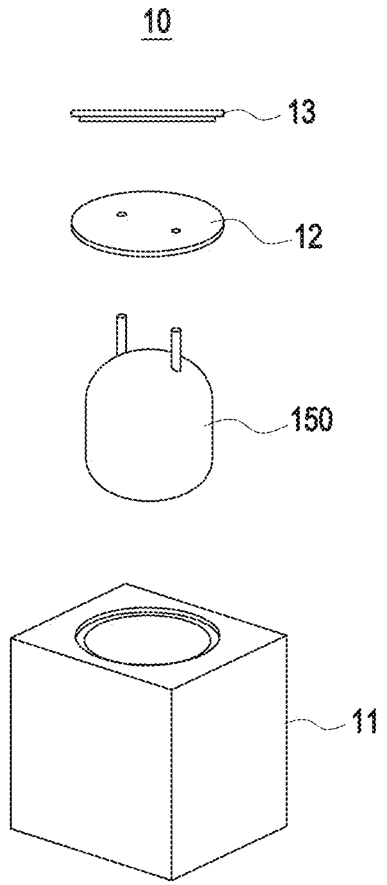
FIG. 1 is an exploded perspective view of a chemical supply device according to various embodiments.

Exemplary embodiments will now be described more fully with reference to the accompanying drawings to clarify the above-described objects, features and advantages of the disclosure. However, various changes may be made to the disclosure and various embodiments may be provided, and hereinafter, specific embodiments illustrated on the drawings will be described in detail.

In the drawings, thicknesses of layers and areas are exaggerated for the sake of clarity. In addition, it will be understood that when an element or a layer is referred to as being "on" another element or layer, the element may be directly on another element or layer or an intervening element or layer interposed therebetween. Throughout the specification, the same reference numerals indicate the same elements in principle. In addition, elements having the same function within the scope of the same technical concept, illustrated on the drawings of respective embodiments, will be described by using the same reference numeral.

Detailed explanations of well-known functions or constructions related to the disclosure are omitted when it is deemed that they may unnecessarily obscure the essence of the disclosure. Numbers used in the detailed descriptions of the disclosure (for example, such terms as 'first' and 'second') are merely identification signs for distinguishing one element from another element.

The terms "area," "portion," "unit" and the terms having suffix "-er" or "-or" used in the detailed descriptions of the disclosure are given or interchangeably used only by considering easiness of drafting of the application, and do not have distinct meanings or roles in themselves.

FIG. 1 is an exploded perspective view of a chemical supply device according to various embodiments.

Referring to FIG. 1, a chemical supply device 10 may include a bubbler 150 and a constant temperature bath 11.

According to various embodiments, the chemical supply device 10 may be used in a semiconductor manufacturing process. In an embodiment, the chemical supply device 10 may provide a chemical material in a gaseous state to be used in a semiconductor manufacturing process to another piece of semiconductor manufacturing equipment. In a certain embodiment, the bubbler 150 may contain a chemical material in a liquid state (hereinafter, referred to as a 'chemical solution'), and may receive a gas (for example, an inert gas) in the bubbler 150. A chemical solution C (see FIGS. 7A, 7B, 8A, and 8B) in the bubbler 150 may be evaporated by introduction of an inert gas, and the evaporated chemical solution C may be used in a semiconductor manufacturing process.

According to various embodiments, a temperature of the chemical solution C in the bubbler 150 needs to be constantly maintained or adjusted for various reasons. For example, an internal temperature of the chemical supply device 10 may be increased to enhance evaporation efficiency of the chemical solution C, or may be constantly maintained to constantly maintain evaporation of the chemical solution C. The chemical supply device 10 may include the constant temperature bath 11 to adjust the temperature of the chemical solution C contained in the bubbler 150.

According to various embodiments, the constant temperature bath 11 may accommodate the bubbler 150. The constant temperature bath 11 may adjust the temperature of the chemical solution C in the bubbler 150 while accommodating the bubbler 150. The constant temperature bath 11 may include a heating module to increase the temperature of the chemical solution C, and/or a cooling module to reduce the temperature of the chemical solution C. In an embodiment, the heating module (not shown) may be disposed to enclose a side surface of the bubbler 150. In a certain embodiment, the cooling module (for example, a Peltier effect module) may be disposed on a lower portion of the bubbler 150

In addition, the chemical supply device 10 may further include a cover 13 to prevent the bubbler 150 from being exposed to the outside, and a buffering member 12 to buffer an impact. The buffering member 12 may be coupled with the cover 13 to be integrally formed therewith.

Thermal conductivity between the constant temperature bath 11 and the bubbler 150 may need to be high to enhance temperature adjustment efficiency of the bubbler 150. According to various embodiments, the chemical supply device 10 may include a heat transferring structure to enhance thermal conductivity between the constant temperature bath 11 and the bubbler 150.

Hereinafter, a heat transferring structure according to various embodiments will be described with reference to the drawings. A heat transferring structure according to various embodiments may be provided by a combination of a constant temperature bath 11, a bubbler 150, and a heat transferring member (for example, a heat transferring member 106 of FIG. 3).

Figure 2A:
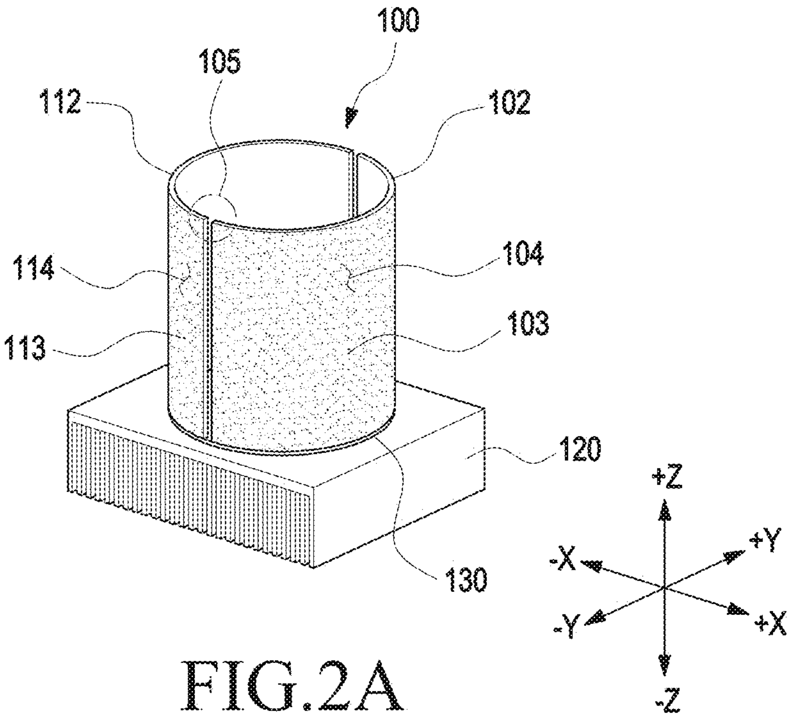
FIG. 2A is a view illustrating an implementation example of a cup according to various embodiments.
Figure 2B:
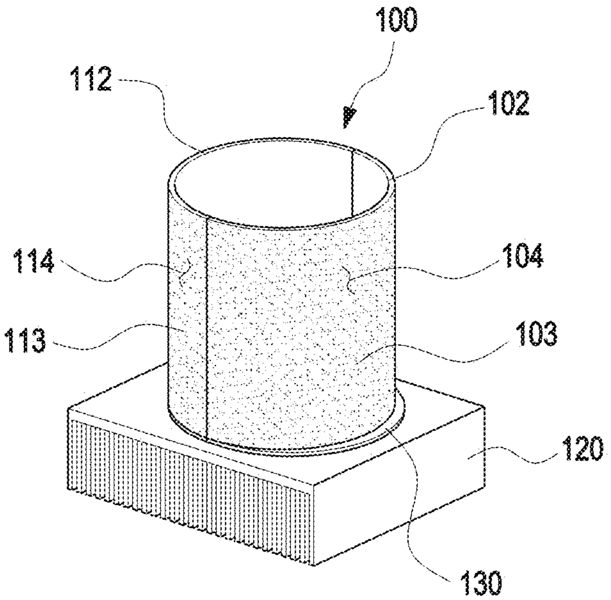
FIG. 2B is a view illustrating an implementation example of a cup according to various embodiments.
Figure 3A:
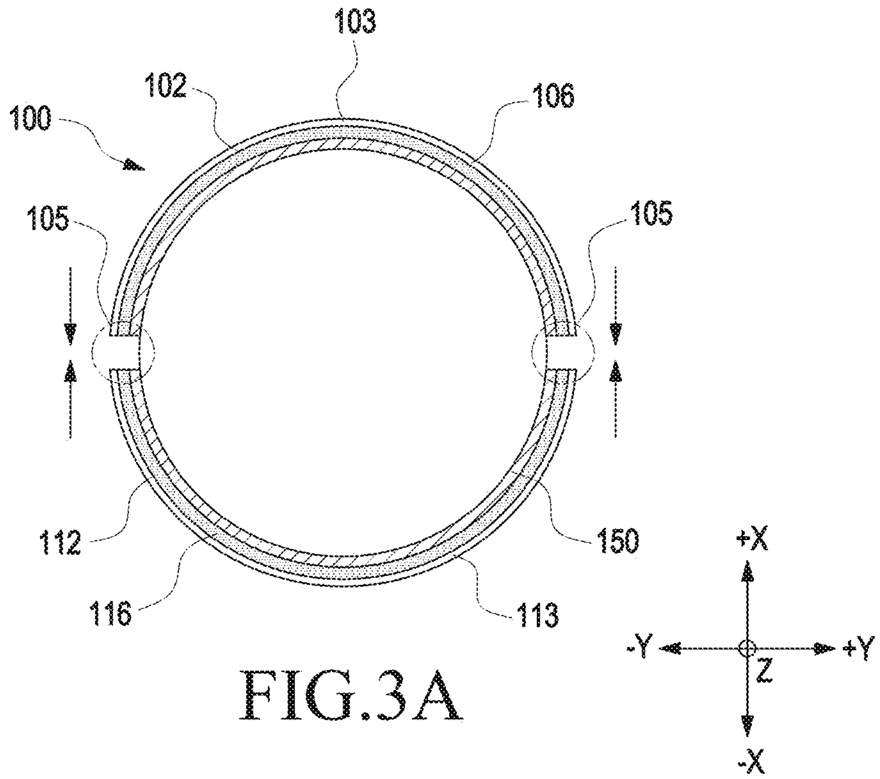
FIG. 3A is a view illustrating the implementation example of FIG. 2A as viewed from above.
Figure 3B:
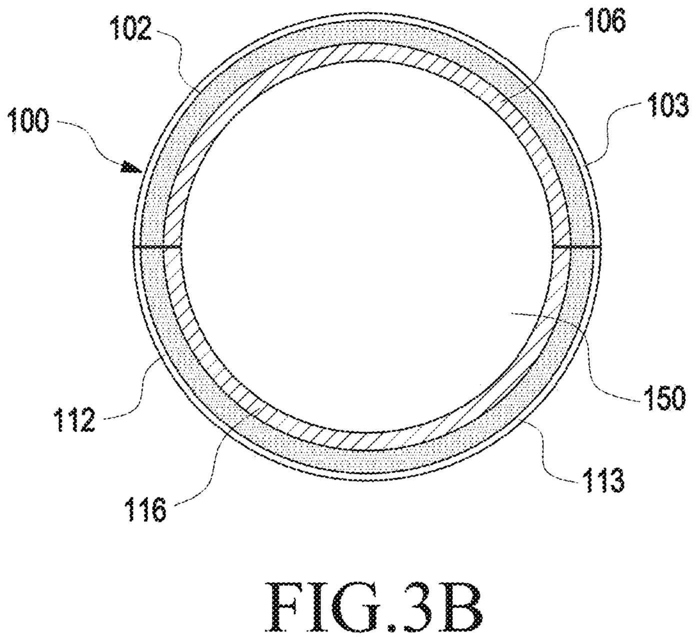
FIG. 3B is a view illustrating the implementation example of FIG. 2B as viewed from above.

FIG. 2A is a view illustrating an implementation example of a cup according to various embodiments, and FIG. 2B is a view illustrating an implementation example of a cup according to various embodiments. FIG. 3A is a view illustrating the implementation example of FIG. 2A as viewed from above, and FIG. 3B is a view illustrating the implementation example of FIG. 2B as viewed from above.

Referring to FIGS. 2A, 2B, 3A, and 3B, the constant temperature bath 11 may include a heat sink 120, a seating portion 130 disposed on the heat sink 120, and a cup 100 disposed to be operable on the seating portion 130.

According to various embodiments, the cup 100 may provide an accommodation space to accommodate the bubbler 150. In an embodiment, the cup 100 may include a first support member 102 and a second support member 112. The first support member 102 and the second support member 112 may be symmetric to each other, and explanations of the first support member 102 may be applied to the second support member 112 in whole or in part.

According to various embodiments, the cup 100 may have a hollow cylindrical shape. The inside of the cup 100 may be provided as an accommodation space to have the bubbler 150 seated therein. In an embodiment, the cup 100 may be opened or closed. For example, the cup 100 may operate between an open state (for example, FIG. 2A or 3A) and a closed state (for example, FIG. 2B or 3B). In an embodiment, the first support member 102 and/or the second support member 112 may be moved to allow the cup 100 to operate between the open state and the closed state. For example, the second support member 112 may be fixed onto the seating portion 130, and the first support member 102 may be movable on the seating portion 130. In another example, both the first support member 102 and the second support member 112 may be movable. In still another example, the first support member 102 may be fixed and the second support member 112 may be movable.

According to various embodiments (referring to FIGS. 2A and 3A), when the cup 100 is in the open state, the bubbler 150 may be placed in the accommodation space in the cup 100. When the cup 100 is in the open state, a space 105 may be provided between the first support member 102 and the second support member 112. When the cup 100 is in the open state, a diameter of the inner space of the cup 100 may be larger than a diameter (width) of the bubbler 150.

According to various embodiments, a first heat transferring member 106 may be disposed on an inside surface (−x axis direction) of the first support member 102. In an embodiment, the first heat transferring member 106 may include an elastic material. For example, the first heat transferring member 106 may include a silicon material. In a certain embodiment, the first heat transferring member 106 may further include a particle for increasing thermal conductivity. For example, the particle may be a metallic material. In another example, the particle may be silica, glass fiber, and/or polymer (for example, polyamide). For example, the first support member 102 may refer to a member in which a particle for enhancing thermal conductivity is disposed within an elastic material widely spread in the first support member 102. All of the explanations of the first heat transferring member 106 may be applied to a second heat transferring member 116 disposed on an inside surface (+x axis direction) of the second support member 112, and thus redundant explanations are omitted.

According to various embodiments, the first heat transferring member 106 and/or the second heat transferring member 116 may include a material (for example, silicon) of a high friction coefficient, and the cup 100 may enter an open state to prevent the bubbler 150 from being hindered from being seated due to a friction.

According to various embodiments (referring to FIGS. 2B and 3B), after the bubbler 150 is seated in the cup 100 in the open state, the cup 100 may operate in the closed state. In the closed state, the space 105 may be removed as the first support member 120 and the second support member 112, and the first heat transferring member 106 and the second heat transferring member 116 come close contact with each other. In an embodiment, in the closed state, the diameter (width) of the inner space of the cup 100 may be the same as or slightly smaller than the diameter (width) of the bubbler 150. Even if the width of the inner space of the cup 100 is smaller than the width of the bubbler 150, the bubbler 150 may be seated in the cup 100 due to elasticity of the first heat transferring member 106 and/or the second heat transferring member 116. In this case, the first heat transferring member 160 and the second heat transferring member 116 may be in close contact with the bubbler 150.

According to various embodiments, a heating module may be disposed on a periphery of the cup 100 to heat the bubbler 150 disposed in the cup 100. For example, a first heating module 103 may be disposed on a first outer surface 104 of the first support member 102, and a second heating module 113 may be disposed on a second outer surface 114 of the second support member 112.

In a certain embodiment, the first heating module 103 and the second heating module 113 may be electrically disconnected from each other. That is, in the open state of the cup 100, the first support member 102 and the second support member 112 may be physically separated from each other, and the first heating module 103 and the second heating module 113 disposed on the first support member 102 and the second support member 112, respectively, may not electrically interfere with each other.

According to an embodiment, the first heating module 103 may be disposed to enclose all or a part of the first outer surface 104 of the first support member 102. For example, the first heating module 103 may be provided as a heating jacket that is widely spread on the first outer surface 104. In another example, the first heating module 103 may be provided in the form of a film. Specifically, the first heating module 103 may be a plate heater including a resistor such as graphene, carbon nanotube (CNT), silver nano wire and/or copper. All explanations of the first heating module 103 may be applied to the second heating module 113, and thus redundant explanations are omitted.

According to various embodiments, the seating portion 130 may include a cooling module (not shown) to cool the bubbler 150. For example, the cooling module may be an element (Peltier effect module) to cause the Peltier effect.

In a certain embodiment, as the cup 100 is moved from the open state to the closed state, a buffer area 131 of the seating portion 130 may be exposed. That is, a lower area (−z axis direction) of the cup 100 contacting the seating portion 130 may vary according to whether the cup 100 is in the open state or closed state. When the cup 100 is in the closed state, the cooling module may be disposed only in a certain area of the seating portion 130 that is in contact with the cup 100 in order to increase power efficiency. In other words, the cooling module may not be disposed in the buffer area 131. However, this is merely an example and the cooling module may be disposed in the overall seating portion 130 for convenience of a manufacturing process.

Figure 4:
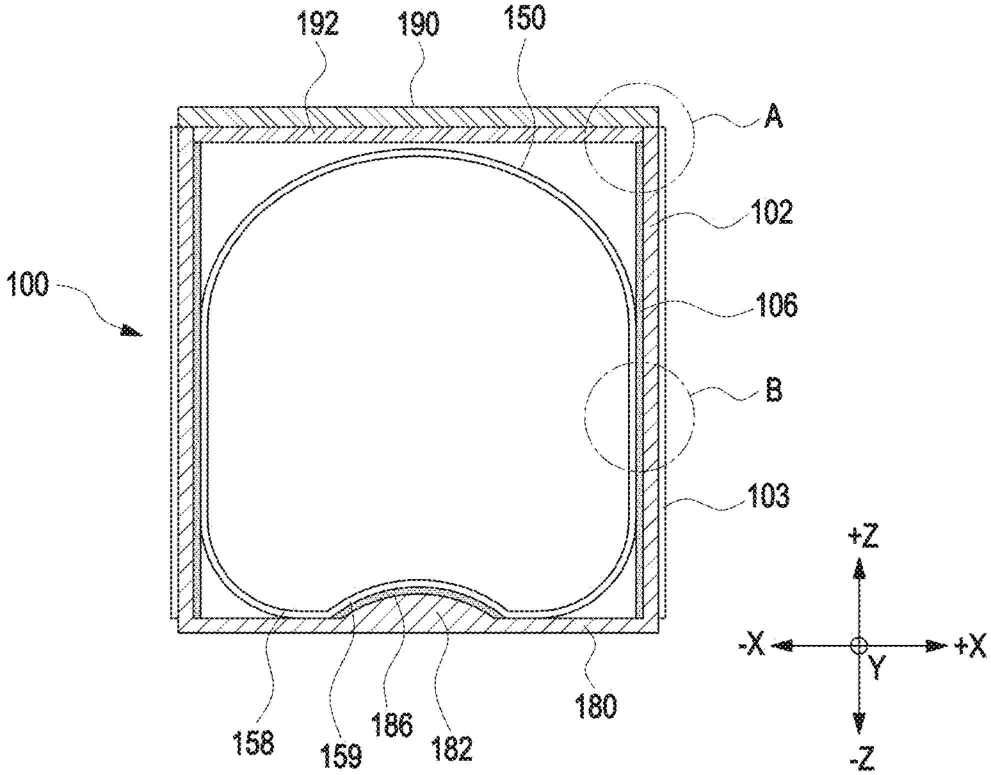
FIG. 4 is a cross-sectional view illustrating a chemical supply device according to various embodiments.
Figure 5:
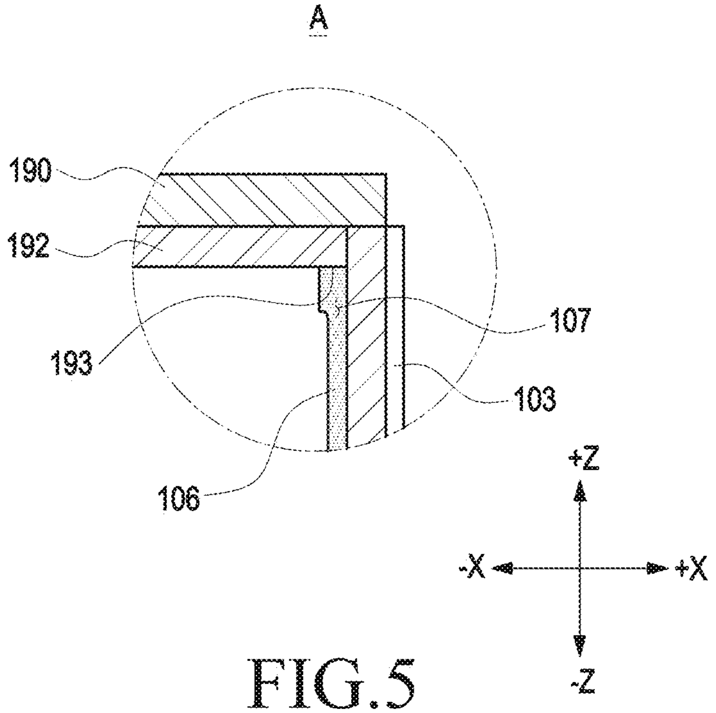
FIG. 5 is a view illustrating the A area of FIG. 4.
Figure 6:
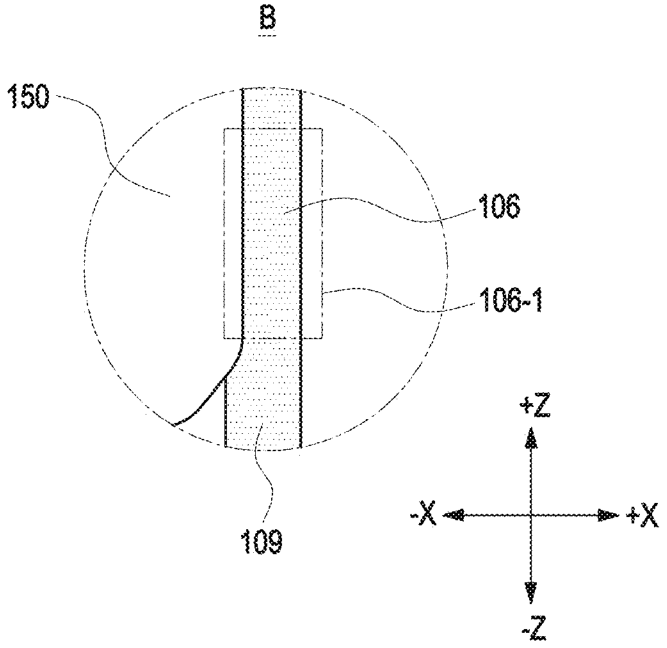
FIG. 6 is a view illustrating the B area of FIG. 4.

FIG. 4 is a cross-sectional view of the chemical supply device according to various embodiments. FIG. 5 is a view illustrating the A area of FIG. 4. FIG. 6 is a view illustrating the B area of FIG. 4.

Referring to FIGS. 4, 5, and 6, the bubbler 150 may include a concave portion 159 formed substantially in a center area of a lower (−z axis direction) area 158, and the cup 100 may include a protrusion 182 formed on a bottom surface 180 thereof.

In an embodiment, the protrusion 182 may be inserted into the concave portion 159. The protrusion 182 and the concave portion 159 may guide a seating position of the bubbler 150 in the cup 100, and may fix the position of the bubbler 150.

According to various embodiments, a third heat transferring member 186 may be disposed to enclose the protrusion 182. Explanations of the first heat transferring member 106 and/or the second heat transferring member 116 may be applied to the third heat transferring member 186. As described above, a cooling module may be disposed on a lower portion (−z axis direction) of the cup 100, and the third heat transferring member 186 may be disposed between the concave portion 159 and the protrusion 182 to enhance cooling efficiency achieved by the cooling module.

According to various embodiments, a cover 190 may be disposed on an upper portion (+z axis direction) of the cup 100. The cover 190 may prevent the bubbler 150 from being exposed to the outside of the chemical supply device 10 (see FIG. 1). The cover 190 of FIGS. 4, 5, and 6 may be the same as or similar to the cover 13 of FIG. 1 in whole or in part.

According to various embodiments (referring to FIG. 5), an elastic member 192 may be disposed on a lower portion (−z axis direction) of the cover 190 to face the inside of the cup 100. Referring to FIG. 5, when the cover 190 is mounted, the elastic member 192 may press a first upper area 107 of the first heat transferring member 106. The elastic member 192 may press the first upper area 107 and may come into close contact therewith in order to completely seal the inside of the cup 100 and to make it easy to adjust the temperature of the bubbler 150. A width (a width in the x-axis direction) of the first supper area 107 which is pressed by the elastic member 192 may be larger than a width (a width in the x-axis direction) of the other area of the first heat transferring member 106.

According to various embodiments (referring to FIG. 6), a certain area 106-1 of the first heat transferring member 106 may be pressed by the bubbler 150. As described above with reference to FIGS. 2 and 3, the width of the inside area of the cup 100 (a width in the x-axis direction or a width in the y-axis direction) may be smaller than the width of the bubbler (a width in the x-axis direction or a width in the y-axis direction), and accordingly, when the cup 100 is in the closed state, the certain area 106-1 of the first heating transferring member 106 may be pressed by the bubbler 150, and the bubbler 150 and the first heat transferring member 106 may come into completely close contact with each other. The pressed certain area 106-1 may have a smaller width than the other area 109 that is not pressed by the bubbler 150. Although the first heat transferring member 106 has been mainly described, it will be understood that the same contents are applied to the second heat transferring member 116.

Figure 7A:
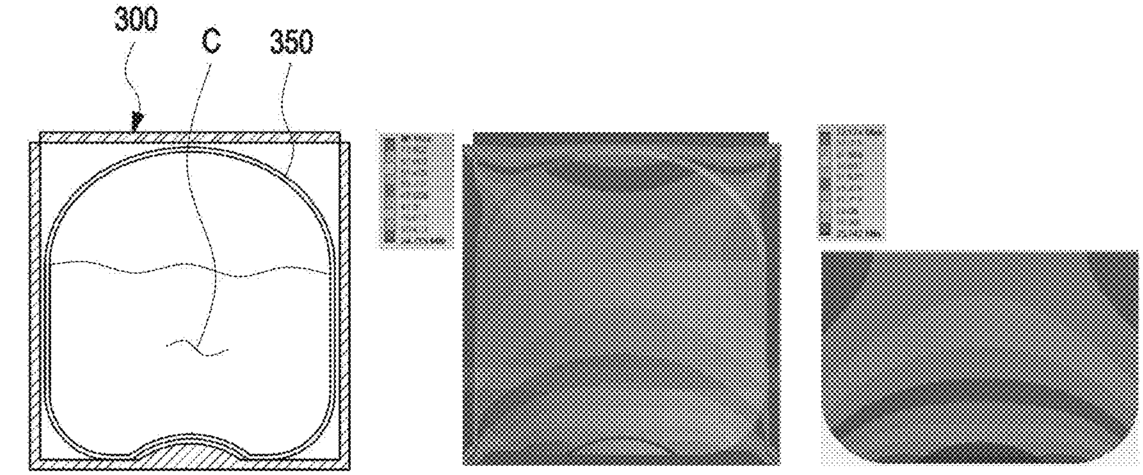
FIG. 7A is a view illustrating a change in internal temperature of a constant temperature bath according to various embodiments.
Figure 7B:
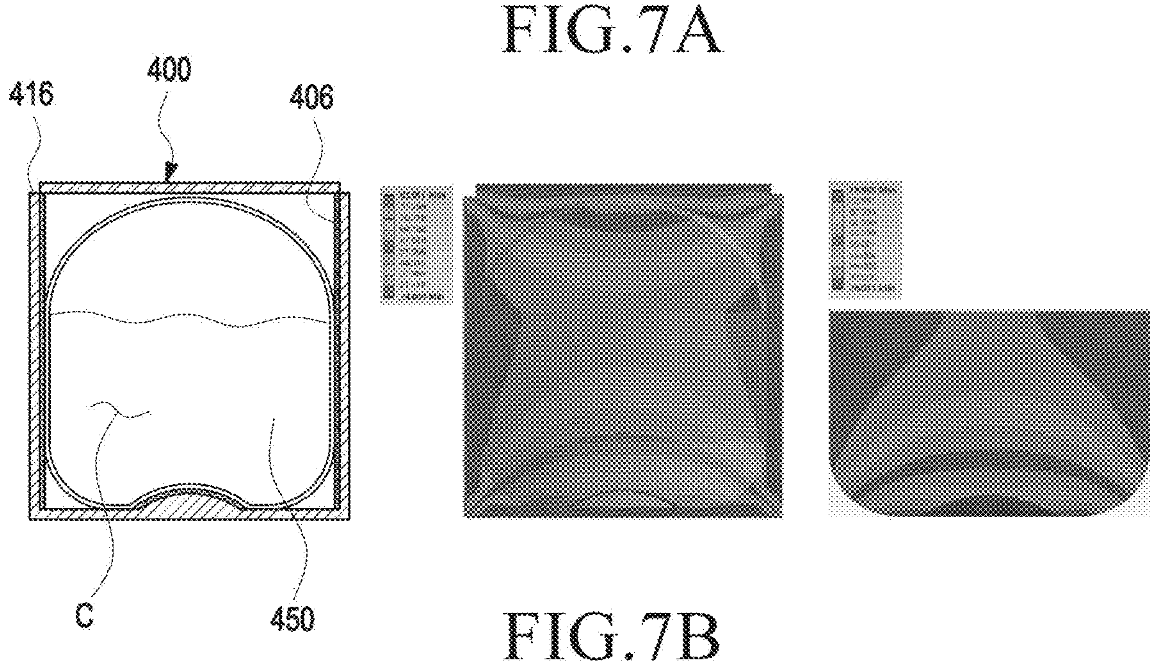
FIG. 7B is a view illustrating a change in internal temperature of a constant temperature bath according to various embodiments.

FIG. 7A illustrates a change in internal temperature of a constant temperature bath according to various embodiments, and FIG. 7B illustrates a change in internal temperature of a constant temperature bath according to various embodiments.

Referring to FIGS. 7A and 7B, results of experiments measuring a change in temperature of a chemical solution C according to the presence/absence of a heat transferring member (for example, the first heat transferring member 106 of FIG. 2) disposed on a side surface of a cup are illustrated.

FIG. 7A illustrates a case where a bubbler 350 was disposed in a cup 300 and a separate heat transferring member (for example, the first heat transferring member 106 of FIG. 2) was not disposed. A gap between a side wall of the cup 300 and the bubbler 350 was set to 2 mm.

FIG. 7B illustrates a case where a bubbler 450 was seated in a cup 400 and the bubbler 450 was in contact with a heat transferring member 406 disposed on an inside wall of the cup 400.

In both the cases of FIGS. 7A and 7B, heat was applied through the sidewall of the cup 300, 400, and temperature of the applied heat was set to 80° C. and external temperature and initial temperature of the chemical solution C were set to 25° C. Herein, thermal conductivity of the heat transferring member 406 was 1 W/m*K.

As results of the experiments, average temperature of the chemical solution C in the bubbler 350 in the case of FIG. 7A measured 58.2° C., and average temperature of the chemical solution C in the bubbler 450 in the case of FIG. 7B measured 68.5° C.

Referring to the results of the experiments, it can be seen that heating efficiency was enhanced due to the heat transferring member 406 disposed on the inside wall 416 of the cup 400, compared to the case of FIG. 7A where there was no heat transferring member 406.

Figure 8A:
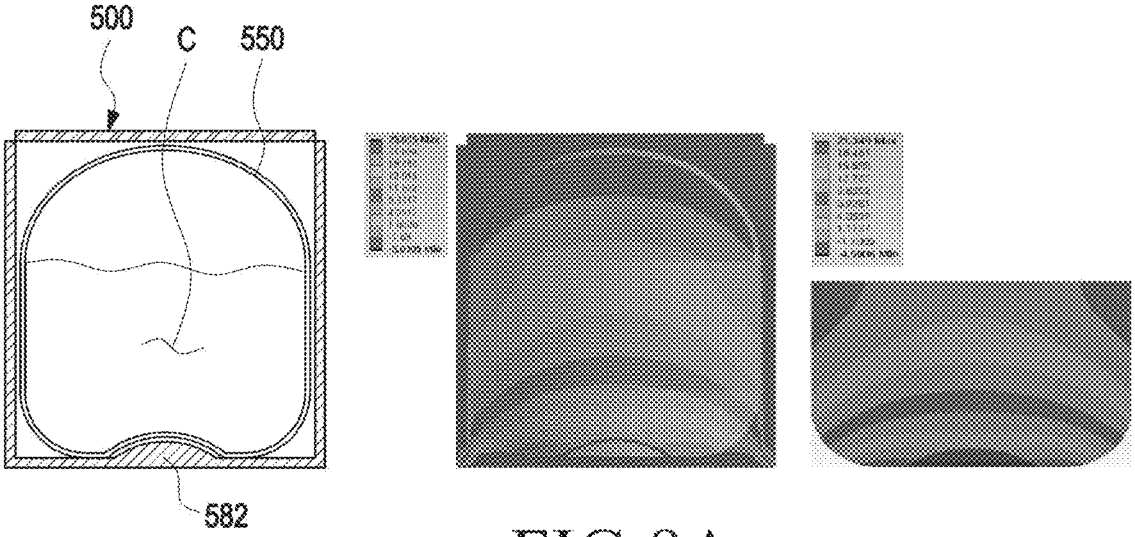
FIG. 8A is a view illustrating a change in internal temperature of a constant temperature bath according to another embodiment.
Figure 8B:
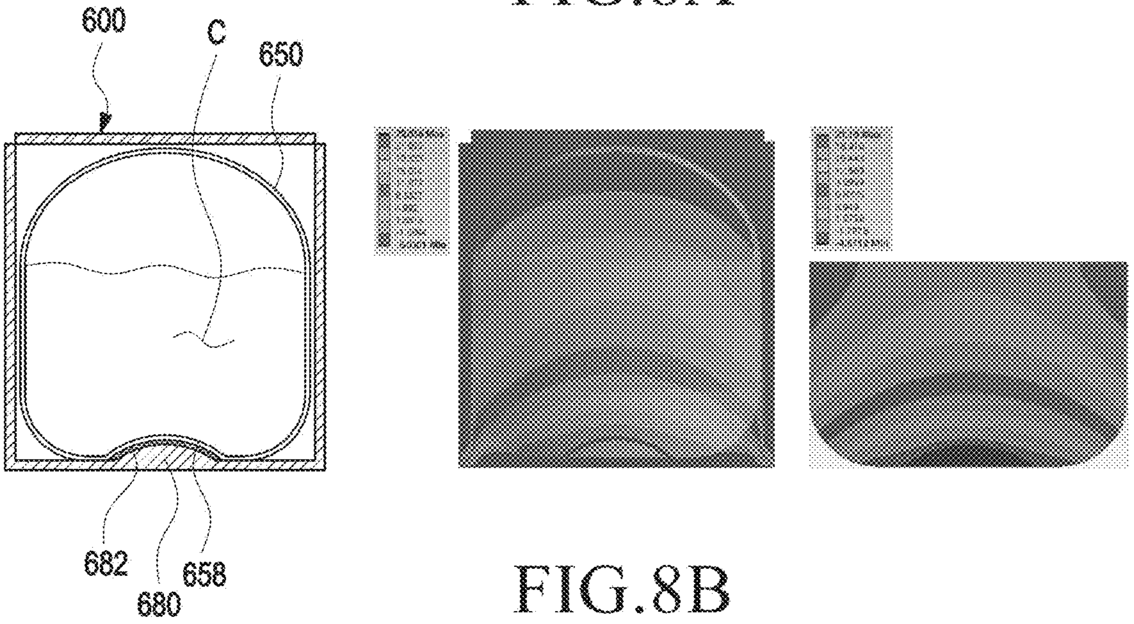
FIG. 8B is a view illustrating a change in internal temperature of a constant temperature bath according to another embodiment.

FIG. 8A illustrates a change in internal temperature of a constant temperature bath according to another embodiment, and FIG. 8B illustrates a change in internal temperature of a constant temperature bath according to another embodiment.

Referring to FIGS. 8A and 8B, results of experiments measuring a change in temperature of a chemical solution C according to the presence/absence of a heat transferring member (for example, the third heat transferring member 186 of FIG. 4) disposed on a lower portion of a cup are illustrated.

FIG. 8A illustrates a case where a bubbler 550 was disposed in a cup 500 and a separate heat transferring member (for example, the third heat transferring member 186 of FIG. 4) was not disposed. A gap between a side wall of the cup 500 and the bubbler 550 was set to 2 mm.

FIG. 8B illustrates a case where a bubbler 650 was seated in a cup 600 and the bubbler 650 included a concave portion 658 to be engaged with a protrusion 682 provided on a lower surface of the cup 600. A heat transferring member 686 was disposed between the protrusion 682 and the concave portion 658.

In both the cases of FIGS. 8A and 8B, the cup 500, 600 was cooled through a lower surface, and applied temperature was set to −5° C. and external temperature and initial temperature of the chemical solution C were set to 25° C. Herein, thermal conductivity of the heat transferring member 686 was 1 W/m*K.

As results of the experiments, average temperature of the chemical solution C in the bubbler 550 in the case of FIG. 8A measured 13.4° C., and average temperature of the chemical solution C in the bubbler 650 in the case of FIG. 8B measured 12.9° C.

Referring to the results of the experiments, it can be seen that cooling efficiency was enhanced due to the heat transferring member 686 disposed on the lower surface 680 of the cup 600, compared to the case of FIG. 8A where there was no heat transferring member 686.

Figure 9:
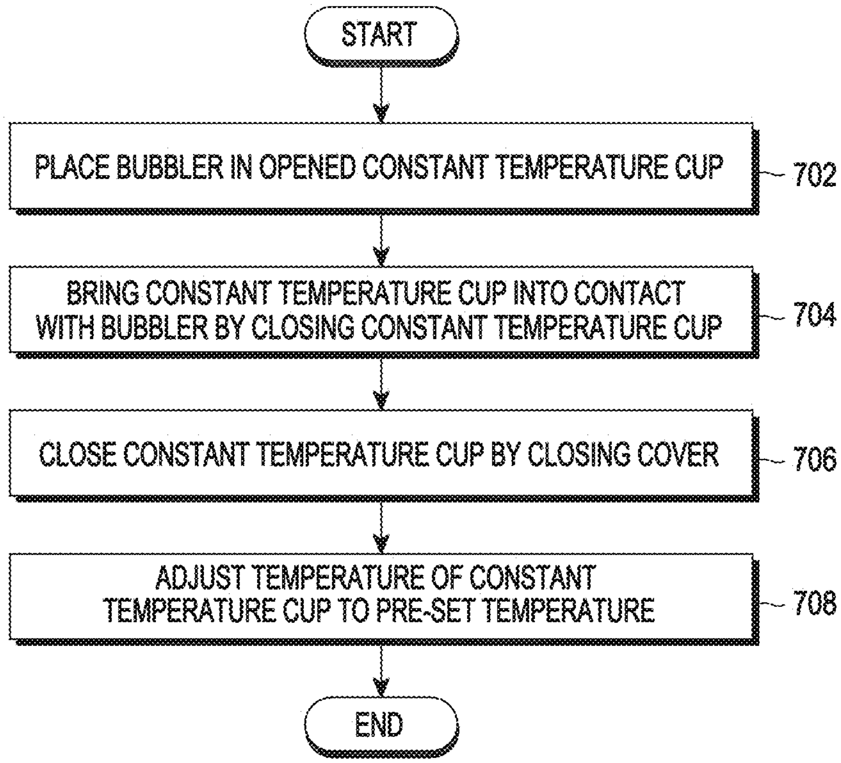
FIG. 9 is a flowchart illustrating an operating method of a constant temperature bath according to various embodiments.

FIG. 9 is a flowchart illustrating an operating method of a constant temperature bath according to various embodiments.

Referring to FIG. 9, the operating method of the constant temperature bath according to various embodiments may include a step of placing a bubbler in an opened constant temperature cup (702), a step of bringing the constant temperature cup into close contact with the bubbler by closing the constant temperature cup (704), a step of closing the constant temperature cup by closing a cover (706), and a step of adjusting a temperature of the constant temperature cup to a pre-set temperature (708). In explaining FIG. 9, contents and reference numerals used in explanations of FIGS. 2A, 2B, 3A, 3B, 4, 5, 6 may also be mentioned.

According to various embodiment, when the cup 100 is in the open state, the bubbler 150 may be placed in the accommodation space in the cup 100 (702). At this time, the first support member 102 and the second support member 112 may be spaced apart from each other, such that the bubbler 150 may be easily seated as described above.

According to various embodiments, after the bubbler 150 is seated, the cup 100 may switch into the closed state and a heat transferring member (for example, the first heat transferring member 106 and/or the second heat transferring member 116) may come into contact with the bubbler 150 (704). Herein, the concave portion 159 of the bubbler 150 may come into close contact with the third heat transferring member 186 disposed on the protrusion 182 of the cup 100.

According to various embodiments, after the bubbler 150 comes into close contact with the first to third heat transferring members 106, 116, 186, respectively, the cover 190 may be closed to close the cup 100 (706).

According to various embodiments, after the cover 190 is seated, the temperature of the chemical solution C contained in the bubbler 150 may be adjusted by using a heating module (for example, the first heating module 103) and a Peltier effect module disposed in the seating portion 130.

Figure 10:
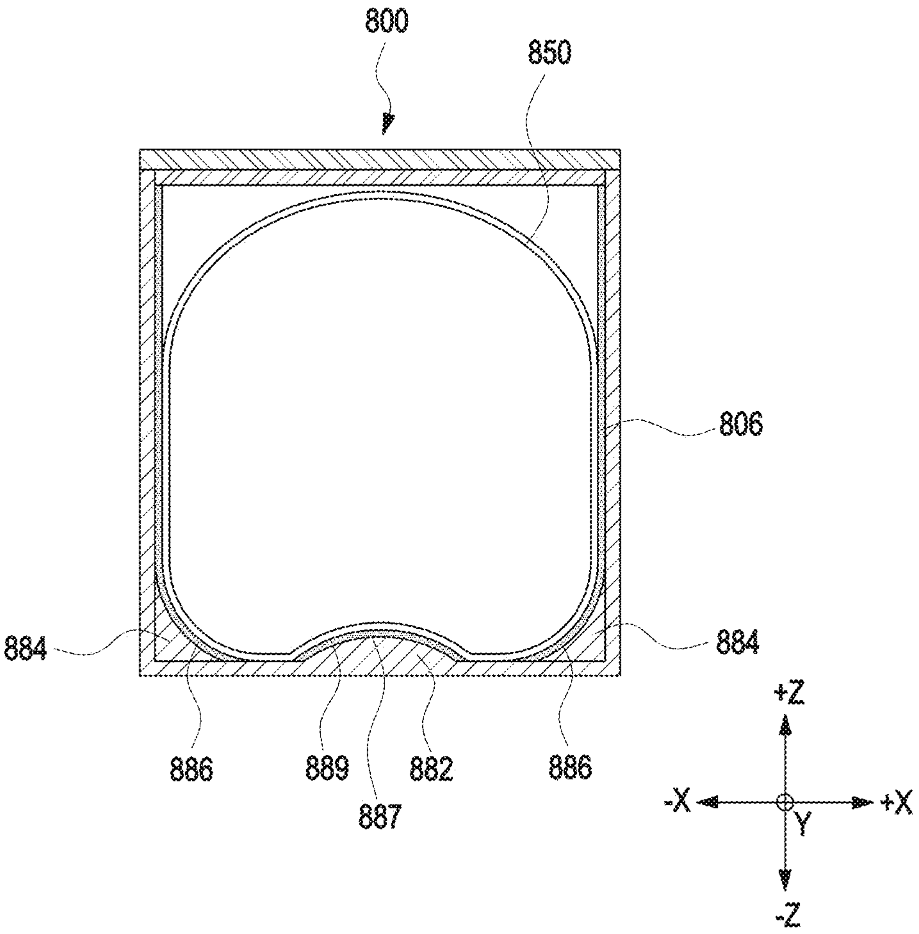
FIG. 10 is a view illustrating a chemical supply device according to still another embodiment.

FIG. 10 is a view illustrating a chemical supply device according to another embodiment.

Referring to FIG. 10, a cup 800 according to another embodiment may include a heat transferring member 806 which encloses the inside of the cup 800. Explanations of the cup 100 and the first to third heat transferring members 106, 116, 186 of FIGS. 2A, 2B, 3A, 3B, 4, 5, 6 described above may be applied to the cup 800 and the heat transferring member 806 of FIG. 10.

According to various embodiments, the cup 800 may include a support area 884. The support area 884 may be provided on a lower (−z axis direction) periphery area of the cup 800. In an embodiment, the support area 884 may support a lower (−z axis direction) circumstance of a bubbler 850.

According to various embodiments, the heat transferring member 806 may be in contact with a side surface (x-axis direction or y-axis direction) of the bubbler 850. Explanations of the first heat transferring member 106 may be applied to a certain area of the heat transferring member 806 which supports the side surface (x-axis direction or y-axis direction) of the bubbler 850.

According to various embodiments, the heat transferring member 806 may include an auxiliary area 886 to come into contact with the lower (−z axis direction) circumstance of the bubbler 850. The first auxiliary area 886 may be disposed on the support area 884.

According to various embodiments, the heat transferring member 806 may include a second auxiliary area 887 to come into contact with a concave portion 889 of the bubbler 850. Explanations of the third heat transferring member 186 described above may be applied to the second auxiliary area 887.

According to various embodiments, all or a part of a certain area enclosing the side surface of the bubbler 850, the first auxiliary area 886, and the second auxiliary area 887 may be integrally provided. For example, the heat transferring member 806 may be disposed to enclose the whole inside surface of the cup 800. The heat transferring member 806 may enclose the whole inside surface of the cup 800, so that heating efficiency and cooling efficiency transmitted from the cup 800 to the bubbler 850 may be enhanced, and the bubbler 850 may be stably fixed in the cup 800. In a certain embodiment, the certain area of the heat transferring member 806 to come into contact with a side surface area of the bubbler 850, the first auxiliary area 886, and the second auxiliary area 887 may be separately provided.

According to various embodiments, there may be provided a chemical supply device for use in a semiconductor manufacturing process, the chemical supply device including: a bubbler configured to contain a chemical solution to be used in a semiconductor manufacturing process and to evaporate the chemical solution; a constant temperature bath configured to accommodate the bubbler and to adjust a temperature of the chemical solution; and a heat transferring structure provided by a combination of at least part of the constant temperature bath and the bubbler, and configured to enhance temperature adjustment efficiency of the chemical solution, wherein the heat transferring structure includes: a constant temperature cup configured to provide an accommodation space to have the bubbler seated therein; a heat transferring member disposed between a side surface area of the bubbler and an inner surface of the cup, at least part of the heat transferring member contacting a side surface of the bubbler; and a heating module disposed on an outer surface of the cup.

According to an embodiment, the chemical supply device may further include: a concave portion provided on a lower area of the bubbler; a protrusion provided on a lower area of the cup to be inserted into the concave portion; a third heat transferring member disposed between the protrusion and the concave portion, at least part of the third heat transferring member contacting the concave portion; and a cooling module disposed on a lower portion of the protrusion.

According to an embodiment, the cup may include a first support member and a second support member, the cup may be operable between an open state and a closed state, and the first support member and the second support member may have their periphery areas spaced apart from each other when the cup is in the open state, and the first support member and the second support member may have their periphery areas come into contact with each other when the cup is in the closed state.

According to an embodiment, the heat transferring member may include: a first heat transferring member disposed on an inner surface of the first support member; and a second heat transferring member disposed on an inner surface of the second support member.

According to an embodiment, the heating module may include: a first heating module disposed on an outer surface of the first support member; and a second heating module disposed on an outer surface of the second support member.

According to an embodiment, the heat transferring member may include an elastic material.

According to an embodiment, the heat transferring member may further include a particle constituted by at least one of metal, glass fiber, and polymer.

According to an embodiment, the chemical supply device may further include a cover disposed on an upper area of the cup.

According to an embodiment, the cover may further include an elastic member, and the elastic member MAY BE disposed in contact with an end of one side of the heat transferring member.

According to an embodiment, the heating module may be a plate heater comprising at least one of copper, silver, and graphene.

Although the embodiments have been described with reference to specified embodiments and drawings as described above, various modifications and changes may be made from the above descriptions by a person skilled in the art. For example, even when the above-described technologies are performed in a different order from that described above, and/or components of the above-described structure, device, etc. are coupled or combined in different forms from that described above, or are replaced or substituted with other components or equivalents, appropriate results may be achieved.

Therefore, other implementations, other embodiments, and equivalents to the scope of the claims belong to the scope of the claims presented below.

What is claimed is:

1. A chemical supply device for use in a semiconductor manufacturing process, the chemical supply device comprising:

a bubbler configured to contain a chemical solution to be used in a semiconductor manufacturing process and to evaporate the chemical solution, wherein the bubbler comprises a concave portion provided on a lower area of the bubbler;

a cup with an accommodation space configured to have the bubbler seated therein, wherein the cup comprises a protrusion provided on a lower area of the cup to be inserted into the concave portion of the bubbler;

a heat transferring structure, wherein the heat transferring structure comprises:

a first heat transferring member disposed between a side surface of the bubbler and an inner surface of the cup, at least part of the first heat transferring member contacting the side surface of the bubbler, a heating module disposed on an outer surface of the cup, a cooling module disposed on a lower portion of the protrusion, a second heat transferring member disposed between the protrusion and the concave portion of the bubbler, at least part of the second heat transferring member contacting the concave portion of the bubbler.

2. The chemical supply device of claim 1, wherein the cup comprises a first support member and a second support member, wherein the cup is operable between an open state and a closed state, wherein the first support member and the second support member have their periphery areas spaced apart from each other when the cup is in the open state, and wherein the first support member and the second support member have their periphery areas come into contact with each other when the cup is in the closed state.

3. The chemical supply device of claim 2, wherein the first heat transferring member comprises: a first portion disposed on an inner surface of the first support member; and a second portion disposed on an inner surface of the second support member.

4. The chemical supply device of claim 3, wherein the heating module comprises: a first portion disposed on an outer surface of the first support member; and a second portion disposed on an outer surface of the second support member.

5. The chemical supply device of claim 1, wherein the first heat transferring member comprises an elastic material.

6. The chemical supply device of claim 5, wherein the first heat transferring member further comprises a particle constituted by at least one of metal, glass fiber, and polymer.

7. The chemical supply device of claim 1, further comprising a cover disposed on an upper area of the cup.

8. The chemical supply device of claim 7, wherein the cover further comprises an elastic member, and wherein the elastic member is disposed in contact with an end of one side of the first heat transferring member.

9. The chemical supply device of claim 1, wherein the heating module is a plate heater comprising at least one of copper, silver, and graphene.

* * * * *